US012030179B2

(12) United States Patent
Toyomaki

(10) Patent No.: US 12,030,179 B2
(45) Date of Patent: Jul. 9, 2024

(54) TEACHING METHOD OF TRANSFER DEVICE AND PROCESSING SYSTEM

(71) Applicant: TOKYO ELECTRON LIMITED, Tokyo (JP)

(72) Inventor: Toshiaki Toyomaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 747 days.

(21) Appl. No.: 17/172,572

(22) Filed: Feb. 10, 2021

(65) Prior Publication Data

US 2021/0252694 A1    Aug. 19, 2021

(30) Foreign Application Priority Data

Feb. 13, 2020  (JP) .................................. 2020-022758

(51) Int. Cl.
*B25J 9/00* (2006.01)
*B25J 13/08* (2006.01)
*H01L 21/677* (2006.01)

(52) U.S. Cl.
CPC ............. *B25J 9/0081* (2013.01); *B25J 13/08* (2013.01); *H01L 21/67748* (2013.01); *H01L 21/67751* (2013.01)

(58) Field of Classification Search
CPC ... B25J 9/0081; B25J 13/08; H01L 21/67748; H01L 21/67751
USPC ........................................................ 700/245
See application file for complete search history.

(56) References Cited

U.S. PATENT DOCUMENTS

| 6,510,365 B1 | 1/2003 | Nishinakayama et al. |
| 2014/0126980 A1* | 5/2014 | Wamura ............ H01L 21/67712 414/221 |
| 2016/0011587 A1* | 1/2016 | Dogome .............. B25J 11/0095 700/121 |

FOREIGN PATENT DOCUMENTS

| JP | 2000-127069 A | 5/2000 | |
| JP | 2001-287178 A | 10/2001 | |
| JP | 2001287178 A | * 10/2001 | ....... H01L 21/67766 |
| JP | 2009-016604 A | 1/2009 | |

* cited by examiner

Primary Examiner — Peter D Nolan
Assistant Examiner — Luke Huynh
(74) Attorney, Agent, or Firm — XSENSUS LLP

(57) ABSTRACT

A method and system for teaching a transfer device including a substrate holder and a first detector disposed at the substrate holder is disclosed. The method comprises detecting a vertical position of an object by the first detector while moving the substrate holder in a vertical direction, and setting a teaching position of the substrate holder in the vertical direction based on the detected vertical position of the object; and setting a teaching position of the substrate holder in a horizontal direction based on a horizontal position of the substrate holder at which the substrate holder is detected by a second detector while moving the substrate holder in the horizontal direction, the second detector being disposed at a position different from a position of the transfer device.

16 Claims, 11 Drawing Sheets

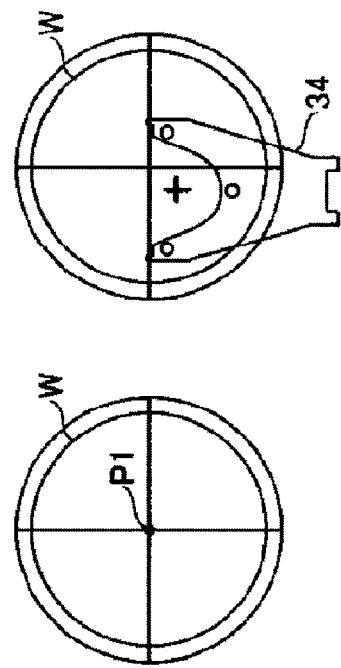
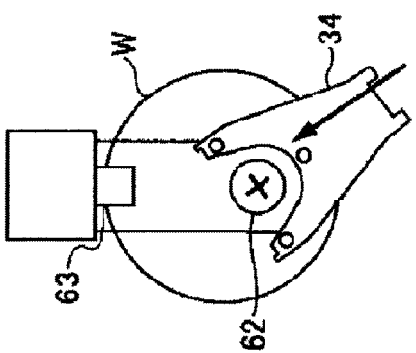
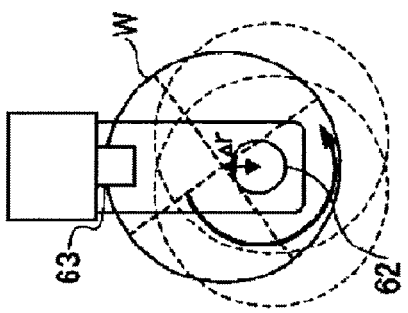
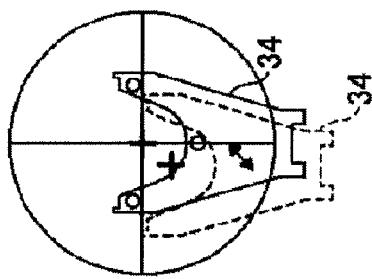
FIG.14A  FIG.14B  FIG.14C  FIG.14D  FIG.14E

TEACHING METHOD OF TRANSFER DEVICE AND PROCESSING SYSTEM

CROSS-REFERENCE TO RELATED APPLICATIONS

This application claims priority to Japanese Patent Application No. 2020-022758, filed on Feb. 13, 2020, the entire contents of which are incorporated herein by reference.

TECHNICAL FIELD

The present disclosure relates to a teaching method of a transfer device and a processing system.

BACKGROUND

In manufacturing semiconductor devices, a processing system including a transfer device for transferring a substrate to a plurality of modules is used. In the processing system, a teaching operation of the transfer device is performed to accurately transfer the substrate into each module.

As an example of the teaching operation of the transfer device, there is known a method for performing rough alignment, transferring a substrate to an aligner, measuring an eccentric amount and an eccentric direction, adjusting temporary position coordinates based on the measured eccentric amount and the eccentric direction, and obtaining appropriate position coordinates (see, e.g., Japanese Patent Application Publication No. 2000-127069).

SUMMARY

The present disclosure provides a technique capable of shortening a time required for a teaching operation of a transfer device.

In accordance with an aspect of the present disclosure, there is provided a teaching method of a transfer device including a substrate holder configured to hold a substrate and a first detector disposed at the substrate holder, the teaching method comprising: detecting a vertical position of an object by the first detector while moving the substrate holder in a vertical direction, and setting a teaching position of the substrate holder in the vertical direction based on the detected vertical position of the object; and setting a teaching position of the substrate holder in a horizontal direction based on a horizontal position of the substrate holder at which the substrate holder is detected by a second detector while moving the substrate holder in the horizontal direction, wherein the second detector is disposed at a position different from a position of the transfer device.

BRIEF DESCRIPTION OF THE DRAWINGS

The objects and features of the present disclosure will become apparent from the following description of embodiments, given in conjunction with the accompanying drawings, in which:

FIGS. 14A to 14E explain an example of a second teaching process.

DETAILED DESCRIPTION

Figure 1:
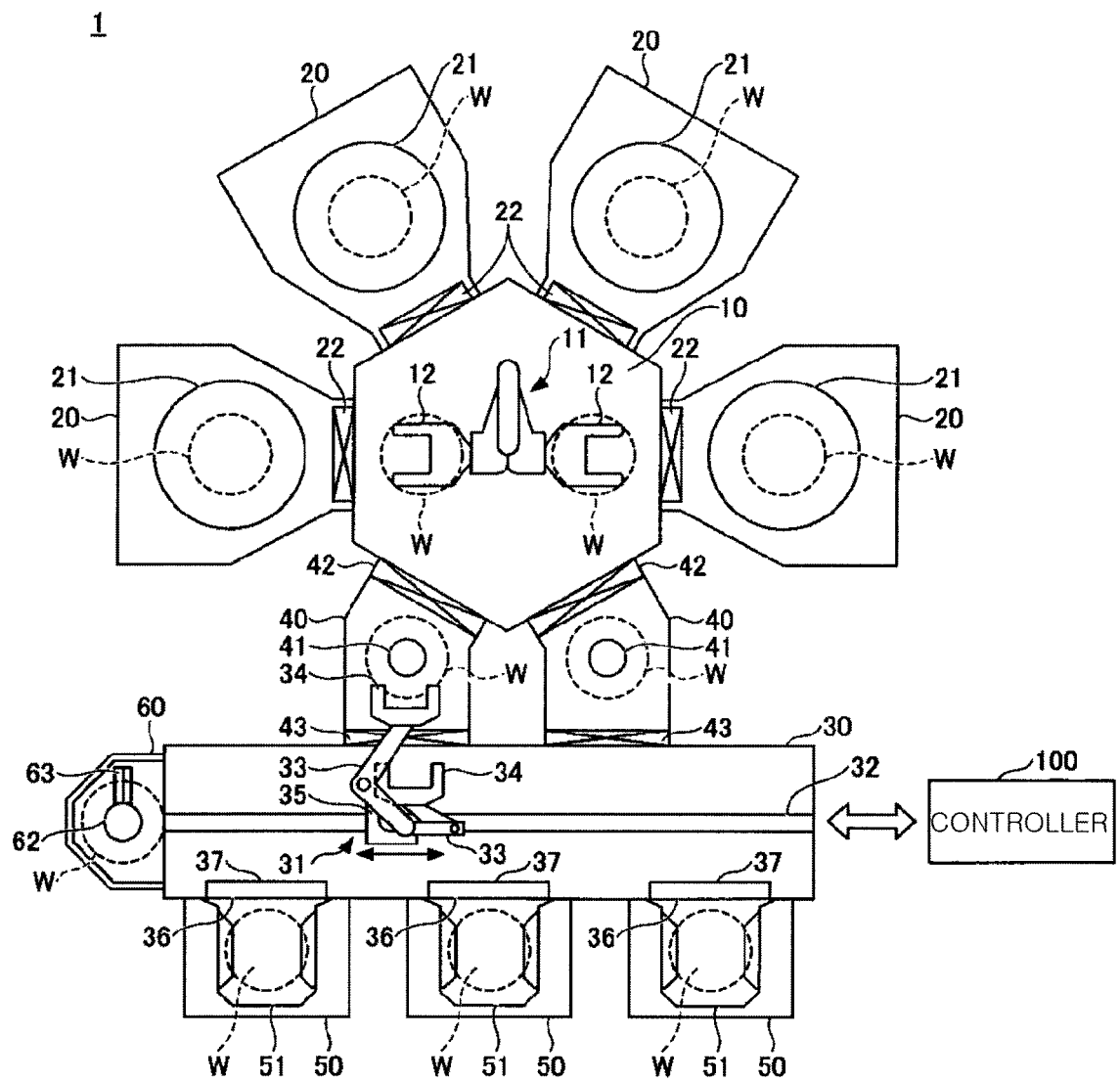
FIG. 1 shows a schematic configuration of a processing system according to an embodiment.

Hereinafter, non-limiting exemplary embodiments will be described in detail with reference to the accompanying drawings. Like reference numerals will be given to like or corresponding parts throughout the drawings, and redundant description thereof will be omitted.

Figure 2:
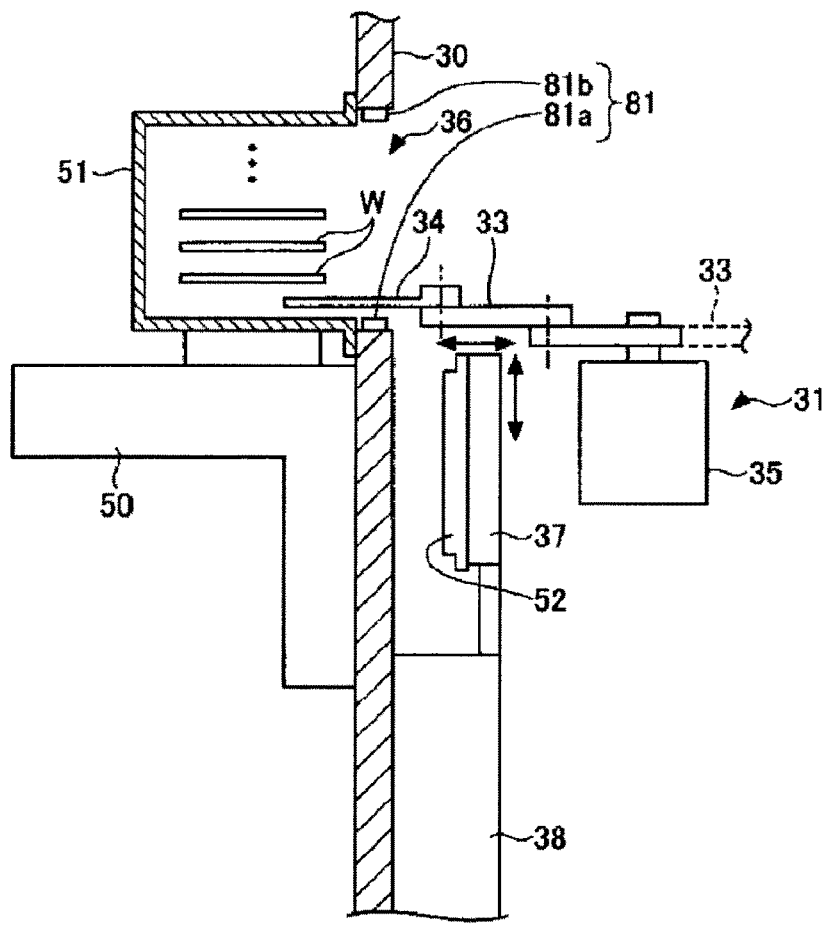
FIG. 2 shows an example of a cross section of a load port.
Figure 3:
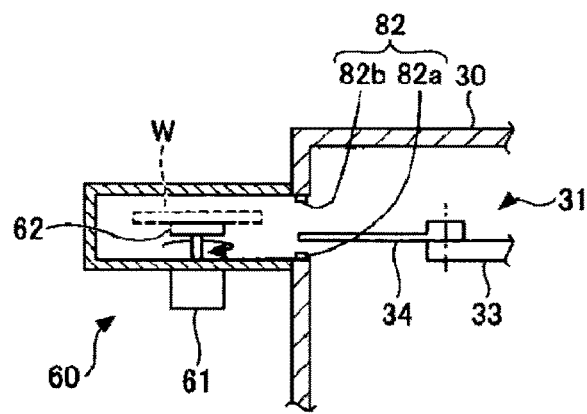
FIG. 3 shows an example of a cross section of an aligner.
Figure 4:
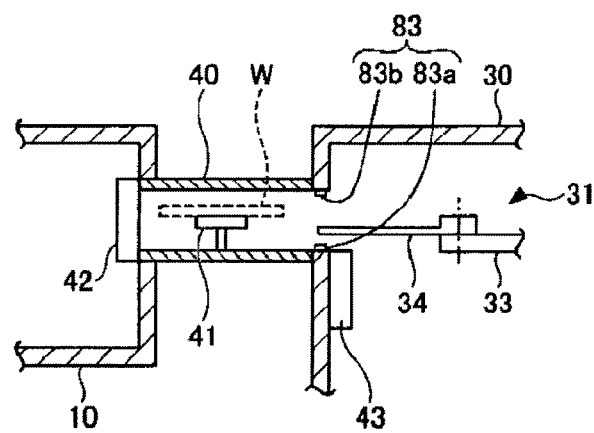
FIG. 4 shows an example of a cross section of a load-lock module.
Figure 5:
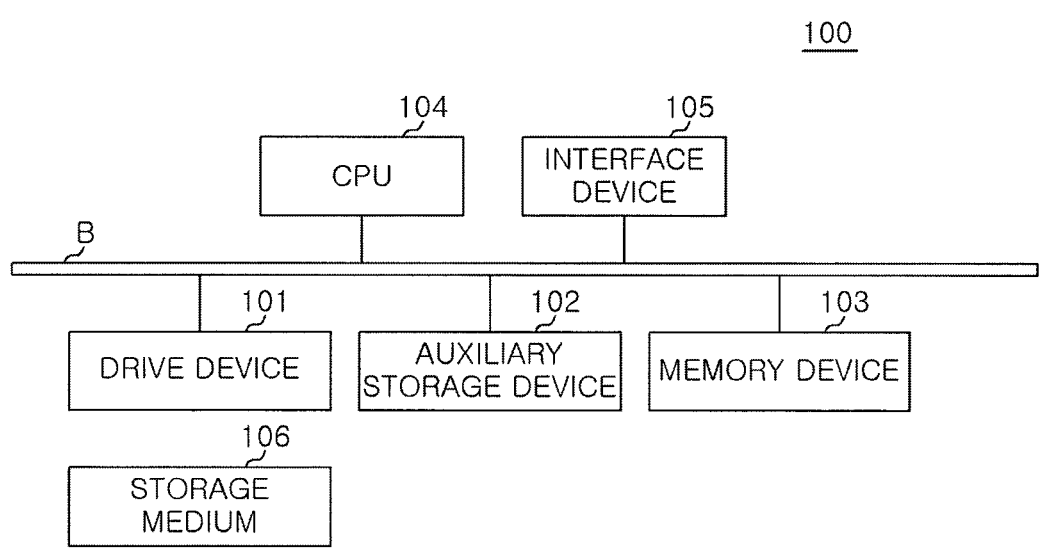
FIG. 5 shows an example of a hardware configuration of a controller.

(Processing system) An example of a processing system to which a teaching method according to an embodiment is applied will be described with reference to FIGS. 1 to 5. FIG. 1 shows a schematic configuration of the processing system according to the embodiment. FIG. 2 shows an example of a cross section of a load port. FIG. 3 shows an example of a cross section of an aligner. FIG. 4 shows an example of a cross section of a load-lock module. FIG. 5 shows an example of a hardware configuration of a controller.

The processing system 1 includes a transfer module 10, process modules 20, a loader module 30, load-lock modules 40, and a controller 100. In the present embodiment, four process modules 20 and two load-lock modules 40 are provided. However, the number of process modules 20 and the number of load-lock modules 40 are not limited thereto. The transfer module 10, the process modules 20, the loader module 30, and the load-lock modules 40 constitute a processing apparatus. The transfer module 10 has a substantially hexagonal shape in plan view. The transfer module 10 is a vacuum chamber and has a transfer device 11 disposed therein. The transfer device 11 is configured as a multi-joint arm that can be extended, contracted, rotated and vertically moved, and is disposed at a position that can access the process modules 20 and the load-lock modules 40. The transfer device 11 has two picks 12 that can be extended and contracted independently in opposite directions, and is configured to transfer two wafers W at a time. The transfer device 11 does not necessarily have the configuration shown in FIG. 1 as long as it can transfer the wafer W between the process module 20 and the load-lock module 40.

The process modules 20 are connected to the transfer module 10 while being arranged radially around the transfer module 10. Each of the process modules 20 is a processing chamber and has therein a cylindrical substrate support 21 for placing a wafer W thereon. In the process modules 20, various semiconductor manufacturing processes are performed on the wafer W placed on the substrate support 21. The semiconductor manufacturing processes include various processes for manufacturing a semiconductor, such as film formation, etching, heat treatment, and the like. The transfer module 10 and the process modules 20 are partitioned by openable/closeable gate valves 22.

The loader module 30 is disposed to face the transfer module 10. The loader module 30 is a transfer chamber having a rectangular parallelepiped shape and maintained in atmospheric pressure. A transfer device 31 is disposed in the loader module 30. The transfer device 31 is slidably supported on a guide rail 32 extending at a central portion in the loader module 30 along the long side thereof. There is, e.g., a linear motor (not shown) having an encoder, is embedded in the guide rail 32, and the transfer device 31 moves along the guide rail 32 by driving the linear motor.

The transfer device 31 has two multi-joint arms 33 respectively arranged in two vertical stages. A pick 34 formed in a bifurcated shape is attached to a tip end of each multi-joint arm 33. A wafer W is held on each pick 34. Each multi-joint arm 33 can be extended and contracted in a radial direction from the center and also vertically moved. The extension and contraction of the multi-joint arms 33 can be individually controlled. The rotation shafts of the multi-joint arms 33 are coaxially and rotatably connected to a base 35, and rotate, it its entirety, about the base 35, for example. The guide rail 32 and the multi-joint arms 33 function as a driving mechanism for moving the picks 34. The transfer device 31 transfers the wafer W among the load-lock modules 40, a transfer container 51, and an aligner 60 that will be described later. The transfer device 31 does not necessarily have the configuration shown in FIG. 1 as long as it can transfer the wafer W among the load-lock modules 40, the transfer container 51, and the aligner 60.

The two load-lock modules 40 are connected to one long side of the loader module 30. One or a plurality of loading ports 36 for loading the wafer W are disposed on the other long side of the loader module 30. In the illustrated example, three loading ports 36 are provided. An opening/closing door 37 is disposed at each of the loading ports 36. Loading ports 50 are also provided, each corresponding to each of the loading ports 36. The transfer container 51 for accommodating and transferring the wafer W is placed on the load port 50. The transfer container 51 is preferably a front opening unified pad (FOUP) that holds and transfers a plurality of (e.g., 25) wafers W in multiple stages at predetermined intervals. Each load port 50 is provided with a driving mechanism 38 for the opening/closing door 37 that can move up/down and back/forth to open/close an opening/closing lid 52 of the transfer container 51 (FIG. 2).

An emergence detection sensor 81 (FIG. 2) is disposed at each loading port 36 of the loader module 30. The emergence detection sensor 81 detects whether or not the wafer W in the transfer container 51 mounted on the load port 50 emerges, and transmits the detection result to the controller 100. In the present embodiment, the emergence detection sensor 81 includes a light transmitting unit 81a and a light receiving unit 81b that are arranged to face each other in the vertical direction with the loading port 36 interposed therebetween. The light transmitting unit 81a is disposed at a bottom portion of the loading port 36, and emits detection light toward the light receiving unit 81b. The light receiving unit 81b is disposed at a top portion of the loading port 36 and receives the detection light emitted from the light transmitting unit 81a. When the detection light emitted by the light projecting unit 81a is not received by the light receiving unit 81b, the emergence detection sensor 81 determines that the wafer W is present between the light transmitting unit 81a and the light receiving unit 81b, and transmits information indicating the emergence of the wafer W to the controller 100. The positional relationship between the light transmitting unit 81a and the light receiving unit 81b may be inverted in the vertical direction.

The aligner 60 is connected to one short side of the loader module 30. The aligner 60 performs position alignment of the wafer W. The aligner 60 has a rotational stage 62 that is rotated by a driving motor 61 (FIG. 3). The rotational stage 62 rotates with the wafer W placed on the upper surface thereof. The rotational stage 62 has a diameter smaller than a diameter of the wafer W. An optical sensor 63 that optically detects a peripheral edge of the wafer W is disposed at an outer periphery of the rotational stage 62. The aligner 60 detects a central position of the wafer W and a direction of a notch with respect to the center of the wafer W using the optical sensor 63, and aligns the wafer W such that the central position of the wafer W and the direction of the notch in the load-lock module 40 become a predetermined position and a predetermined direction, respectively.

An emergence detection sensor 82 (FIG. 3) is disposed at a portion of the loader module 30 that is connected with the aligner 60. The emergence detection sensor 82 detects whether or not the wafer W placed on the rotational stage 62 in the aligner 60 emerges, and transmits the detection result to the controller 100. In the present embodiment, the emergence detection sensor 82 includes a light transmitting unit 82a and a light receiving unit 82b that are arranged to face each other in the vertical direction with the connection portion interposed therebetween. The light transmitting unit 82a is disposed at a bottom portion of the connection portion and emits the detection light toward the light receiving unit 82b. The light receiving unit 82b is disposed at a top portion of the connection portion and receives the detection light emitted from the light transmitting unit 82a. When the detection light emitted by the light transmitting unit 82a is not received by the light receiving unit 82b, the emergence detection sensor 82 determines that the wafer W is present between the light transmitting unit 82a and the light receiving unit 82b, and transmits information indicating the emergence of the wafer W to the controller 100. The positional relationship between the light transmitting unit 82a and the light receiving unit 82b may be inverted in the vertical direction.

The load-lock modules 40 are disposed between the transfer module 10 and the loader module 30. Each of the load-lock modules 40 is a chamber having its inner pressure variable (i.e., switchable between vacuum pressure and atmospheric pressure), and has a cylindrical stage 41 for placing a wafer W thereon is disposed therein. The stage 41 has a diameter smaller than the diameter of the wafer W. In the case of loading the wafer W from the loader module 30 into the transfer module 10, the load-lock module 40, while maintaining its inner pressure at atmospheric pressure, receives the wafer W from the loader module 30; and loads the wafer W into the transfer module 10 while decreasing its inner pressure. In the case of loading the wafer W from the transfer module 10 to the loader module 30, the load-lock module 40, while maintaining its inner pressure at vacuum pressure, receives the wafer W from the transfer module 10; and loads the wafer W into the loader module 30 while increasing its inner pressure up to atmospheric pressure.

The load-lock module 40 and the transfer module 10 are partitioned by an openable/closeable gate valve 42. Further, the load-lock module 40 and the loader module 30 are partitioned by an openable/closable gate valve 43.

An emergence detection sensor 83 (FIG. 4) is disposed at a portion of the loader module 30 that is connected with the load-lock module 40. The emergence detection sensor 83 detects whether or not the wafer W placed on the stage 41 in the load-lock module 40 emerges, and transmits the detection result to the controller 100. In the present embodiment, the emergence detection sensor 83 includes a light transmitting unit 83a and a light receiving unit 83b that are arranged to face each other in the vertical direction with the connection portion interposed therebetween. The light transmitting unit 83a is disposed at a bottom portion of the connection portion and emits the detection light toward the light receiving unit 83b. The light receiving unit 83b is disposed at a top portion of the connection portion and receives the detection light emitted from the light transmitting unit 83a. When the detection light emitted by the light transmitting unit 83a is not received by the light receiving unit 83b, the emergence detection sensor 83 determines that the wafer W is present between the light transmitting unit 83a and the light receiving unit 83b, and transmits information indicating the emergence of the wafer W to the controller 100. The positional relationship between the light transmitting unit 83a and the light receiving unit 83b may be inverted.

The controller 100 controls the operations of the respective components of the processing system 1. As shown in FIG. 5, the controller 100 is a computer including a drive device 101, an auxiliary storage device 102, a memory device 103, a CPU 104, an interface device 105, and the like that are connected to one another by a bus B. A program that implements the processing in the controller 100 is provided by a storage medium 106 such as a CD-ROM or the like. When the storage medium 106 that stores the program is set in the drive device 101, the program is installed in the auxiliary storage device 102 from the storage medium 106 via the drive device 101. However, the program is not necessarily installed from the storage medium 106, and may be downloaded from another computer via a network. The auxiliary storage device 102 stores necessary data such as installed programs, recipes, and the like. The memory device 103 reads out the program from the auxiliary storage device 102 and stores the program therein when there is an instruction for starting the program. The CPU 104 executes a function(s) of the processing system 1 based on the program stored in the memory device 103. The interface device 105 is used as an interface for connection to the network. (Pick)

Figure 6:
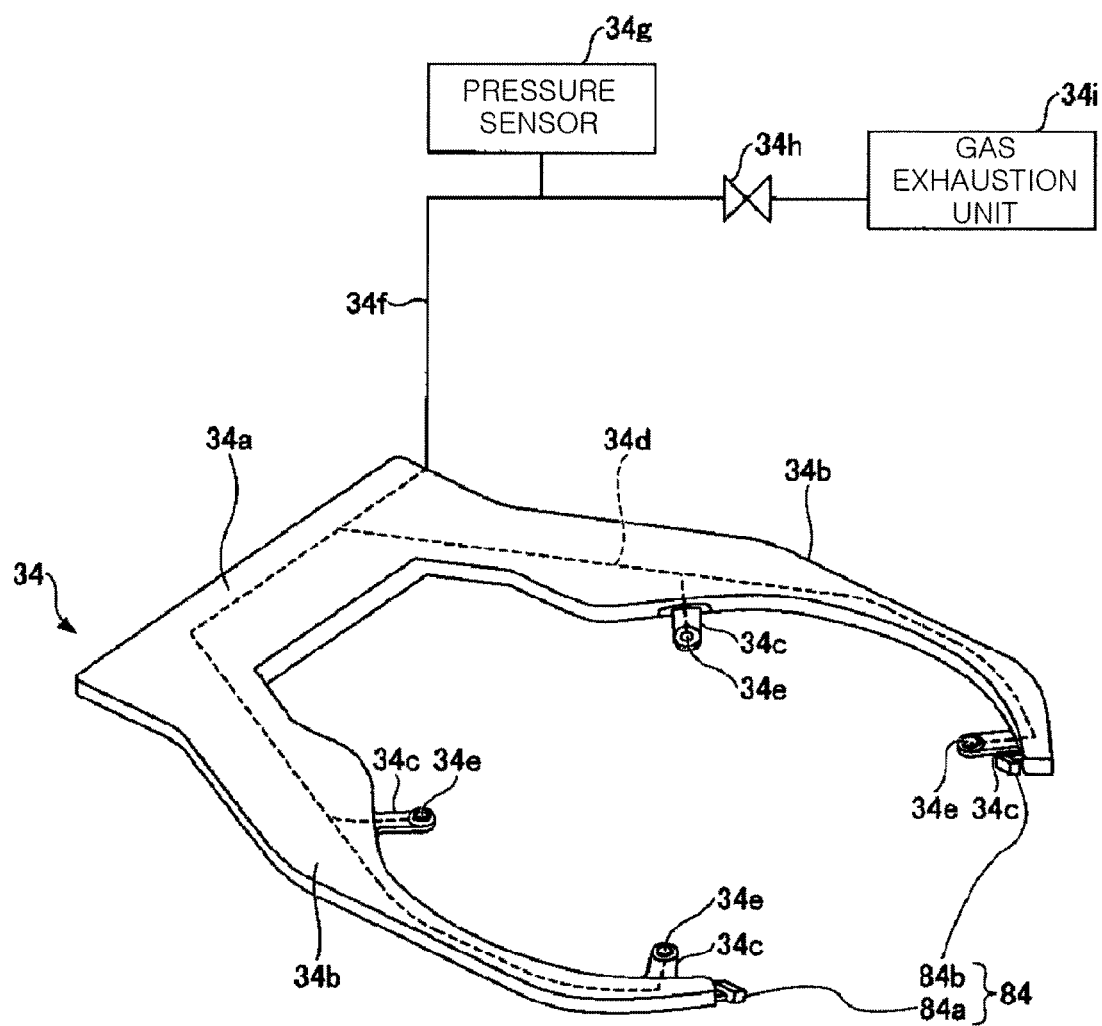
FIG. 6 shows an example of a schematic configuration of a pick.

An example of the pick 34 of the transfer device 31 will be described with reference to FIG. 6. FIG. 6 shows an example of a schematic configuration of the pick 34.

The pick 34 has a base portion 34a, a tip end portion 34b, claw portions 34c, and gas exhaust passages 34d. The base 34a is attached to the multi-joint arm 33. The tip end portion 34b extends from the base portion 34a in a forward direction of the pick 34, forming an arc-like shape. The claw portions 34c project toward a central portion of a region (hereinafter, referred to as "wafer holding region") surrounded by the base portion 34a and the tip end portion 34b. The four claws 34c are arranged at intervals along the periphery of the wafer holding region. A suction hole 34e is formed at an upper part of each claw portion 34c, and a peripheral portion of a backside of the wafer W is held, by vacuum attraction, on the claw portions 34c to block the suction holes 34e. The gas exhaust passages 34d are formed in the base portion 34a and the tip end portion 34b, and form a suction passage. One end of each gas exhaust passage 34d is connected to one of the suction holes 34e of the claw portions 34c, and the other end of each gas exhaust passage 34d communicates with a gas exhaust line 34f forming the suction passage connected to the pick 34.

A pressure sensor 34g as a pressure detection unit and a valve 34h are provided in the gas exhaust line 34f. The pressure sensor 34g detects the pressure in the gas exhaust line 34f (hereinafter, also referred to as "vacuum attraction pressure") and transmits a signal corresponding to the detected pressure to the controller 100. A gas exhaustion unit 34i is connected to a downstream side of the valve 34h in the gas exhaust line 34f. The gas exhaustion unit 34i includes a regulator, a vacuum pump, and the like, and adjusts the pressure in the gas exhaust passage 34d and the gas exhaust line 34f by way of conducting suction therefrom. The valve 34h is opened when the teaching method of the transfer device 31 to be described later is performed or during a period from immediately before the transfer device 31 receives the wafer W from one module to immediately after the wafer W is loaded to another module. The valve 34h is closed at other times. Accordingly, the suction of gas from the suction holes 34e is performed during the teaching operation of the transfer device 31 and during the period from immediately before the transfer device 31 holds the wafer W to immediately after the wafer W is released.

A mapping sensor 84 is disposed at tip ends of the tip end portion 34b of the pick 34. The mapping sensor 84 detects presence/absence of the wafer W and a vertical position of the wafer W in the transfer container 51 placed on the load port 50, and transmits the detection result to the controller 100. Further, the mapping sensor 84 detects presence/absence of the wafer W and a vertical position of the wafer W placed on the stage 41 in the load-lock module and presence/absence of the wafer W and a vertical position of the wafer W placed on the rotational stage 62 in the aligner 60, and transmits the detection results to the controller 100. In the present embodiment, the mapping sensor 84 includes a light transmitting unit 84a and a light receiving unit 84b that are arranged to face each other in the horizontal direction. The light transmitting unit 84a is disposed at one tip end of the tip end portion 34b of the pick 34, and emits detection light toward the light receiving unit 84b. The light receiving unit 84b is disposed at the other tip end of the tip end portion 34b of the pick 34, and receives the detection light emitted from the light transmitting unit 84a. When the detection light emitted by the light transmitting unit 84a is not received by the light receiving unit 84b, the mapping sensor 84 determines that the wafer W is present between the light transmitting unit 84a and the light receiving unit 84b, and transmits information indicating the presence of the wafer W to the controller 100. The positional relationship between the light transmitting unit 84a and the light receiving unit 84b may be inverted.

(Teaching method of transfer device) An example of the teaching method of the transfer device 31 will be described with reference to FIGS. 7 to 14. The teaching method of the transfer device 31 according to the embodiment is a method of setting a teaching position of the transfer device 31 by controlling the operations of the respective components of the processing system 1 under the control of the controller 100. In the present embodiment, the case of setting the teaching position of the transfer device 31 with respect to the load port 50 will be described. However, the present disclosure is also applied to the case of setting the teaching position of the transfer device 31 with respect to the load-lock module 40 or the aligner 60, for example.

The teaching method of the transfer device 31 according to the embodiment is performed, e.g., when the processing system 1 is started, or after the transfer device 31 or a component(s) of the transfer device 31 is replaced, or after maintenance of a target to which the wafer W is loaded by the transfer device 31. The components of the transfer device 31 may be, e.g., the multi-joint arm 33 and the pick 34. Further, the target into which the wafer W is loaded by the transfer device 31 may be, e.g., the load-lock modules 40, the load port 50, and the aligner 60.

Figure 7:
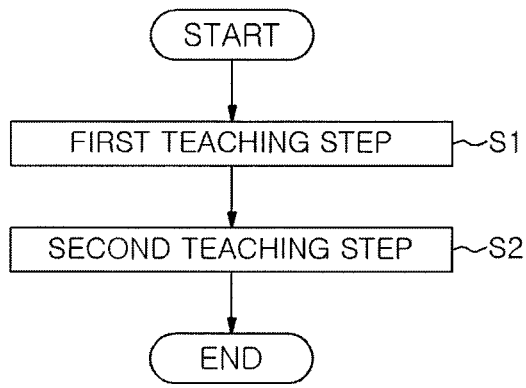
FIG. 7 is a flowchart showing a teaching method of a transfer device according to an embodiment.

FIG. 7 is a flowchart showing the teaching method of the transfer device 31 according to the embodiment. The teaching method of the transfer device 31 according to the embodiment includes a first teaching step S1 and a second teaching step S2. In the first teaching step S1, a teaching position of the transfer device 31 is set. In the second teaching step S2 that is executed after the first teaching step S1, the teaching position of the transfer device 31 set in the first teaching step S1 is adjusted to improve the accuracy.

Figure 8:
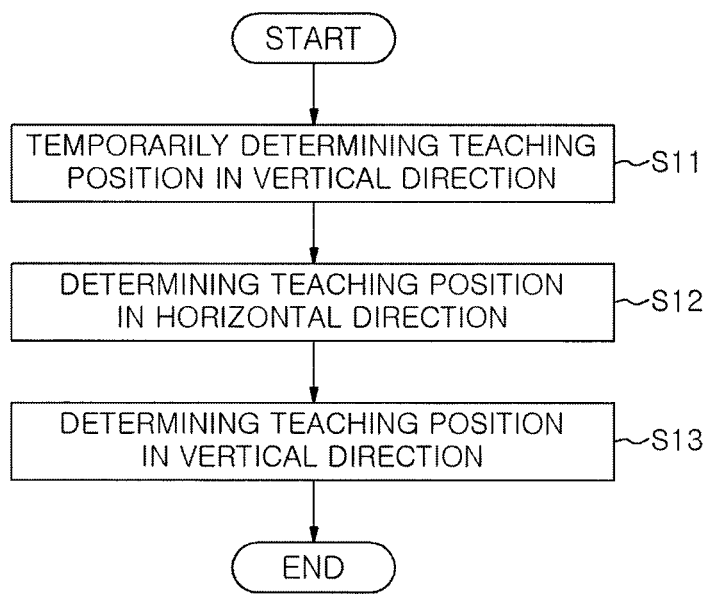
FIG. 8 is a flowchart showing an example of a first teaching process.

The first teaching step S1 will be described with reference to FIG. 8. FIG. 8 is a flowchart showing an example of the first teaching step S1. The first teaching step S1 includes a first step S11 for temporarily determining a teaching position in a vertical direction, a second step S12 for determining a teaching position in a horizontal direction, and a third step S13 for determining the teaching position in the vertical direction.

The first step S11 includes an operation of detecting the vertical position of the wafer W using the mapping sensor 84 while moving the pick 34 in the vertical direction and temporarily determining the teaching position of the pick 34 in the vertical direction based on the detected vertical position of the wafer W. The first step S11 may include an operation of storing the temporarily determined teaching position in, e.g., the auxiliary storage device 102.

Figure 9A:
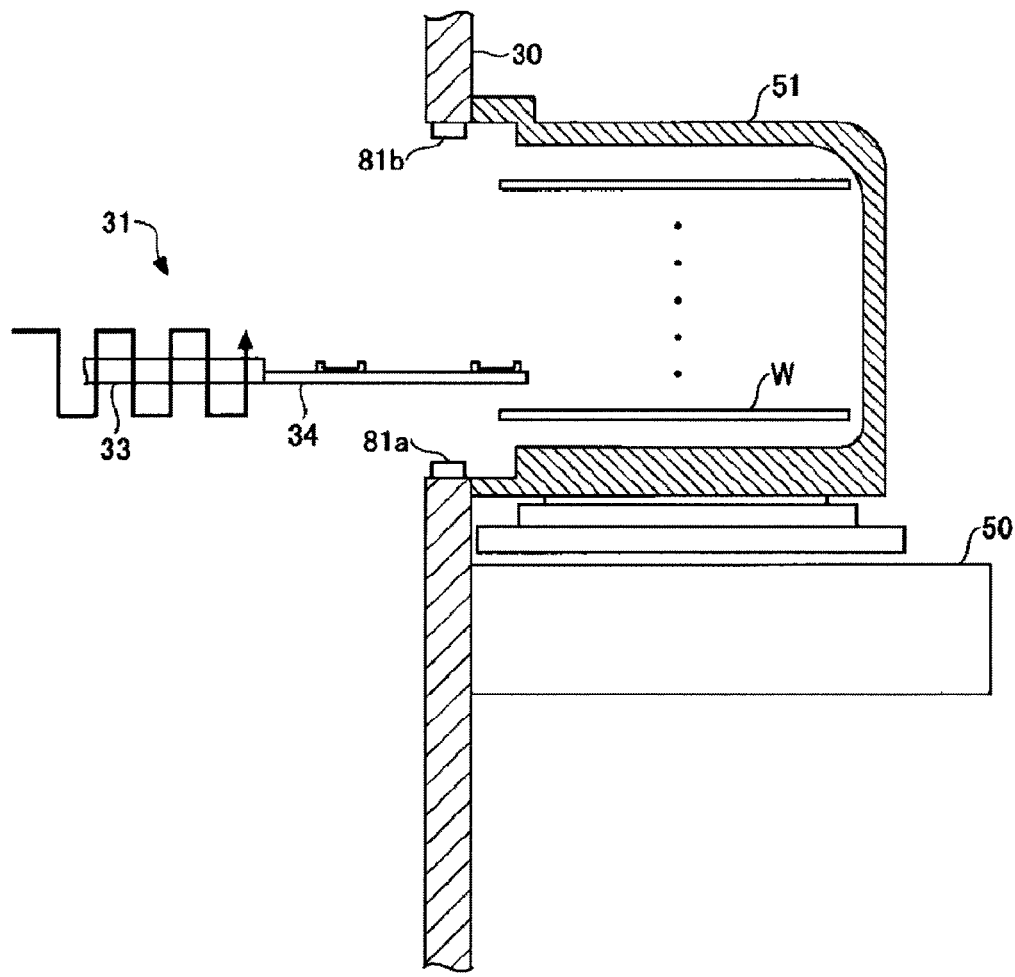
FIGS. 9A and 9B explain a process of temporarily determining a teaching position in a vertical direction.
Figure 9B:
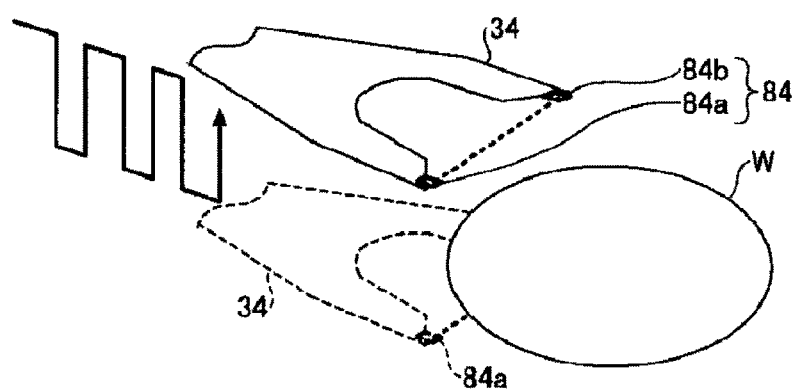

FIGS. 9A and 9B explain a step (first step S11) of temporarily determining the teaching position in the vertical direction. FIGS. 9A and 9B are a cross-sectional view and a perspective view showing the positional relationship between the wafer W and the pick 34 in the transfer container 51, respectively.

In the present embodiment, the controller 100 controls the transfer device 31 to move the pick 34 toward the wafer W while moving the pick 34 up/down to a position so as to pass the vertical position of the wafer W. In other words, the controller 100 repeats an operation of moving the pick 34 toward the wafer W, an operation of moving down the pick 34 to a position so as to pass the vertical position of the wafer W, an operation of moving the pick 34 toward the wafer W, and an operation of moving up the pick 34 to a position so as to pass the vertical position of the wafer W. The controller 100 stores the vertical position of the pick 34 at which the detection light emitted from the light transmitting unit 84a of the mapping sensor 84 toward the light receiving unit 84b is blocked by the wafer W, as the position of the wafer W (the teaching position of the pick 34 in the vertical direction), in the auxiliary storage device 102. In FIG. 9B, the pick 34 located at the raised position is indicated by a solid line; the pick 34 located at the lowered position is indicated by a dashed line; and the detection light is indicated by a dotted line.

The second step S12 is executed after the first step S11. However, the second step S12 may be executed before the first step S11. The second step S12 includes an operation of determining the teaching position of the pick 34 in the horizontal direction based on the horizontal position of the pick 34 at which the emergence detection sensor 81 disposed at the load port 50 detects the pick 34 while moving the pick 34 in the horizontal direction. The second step S12 may include an operation of storing the determined teaching position in, e.g., the auxiliary storage device 102.

Figure 10A:
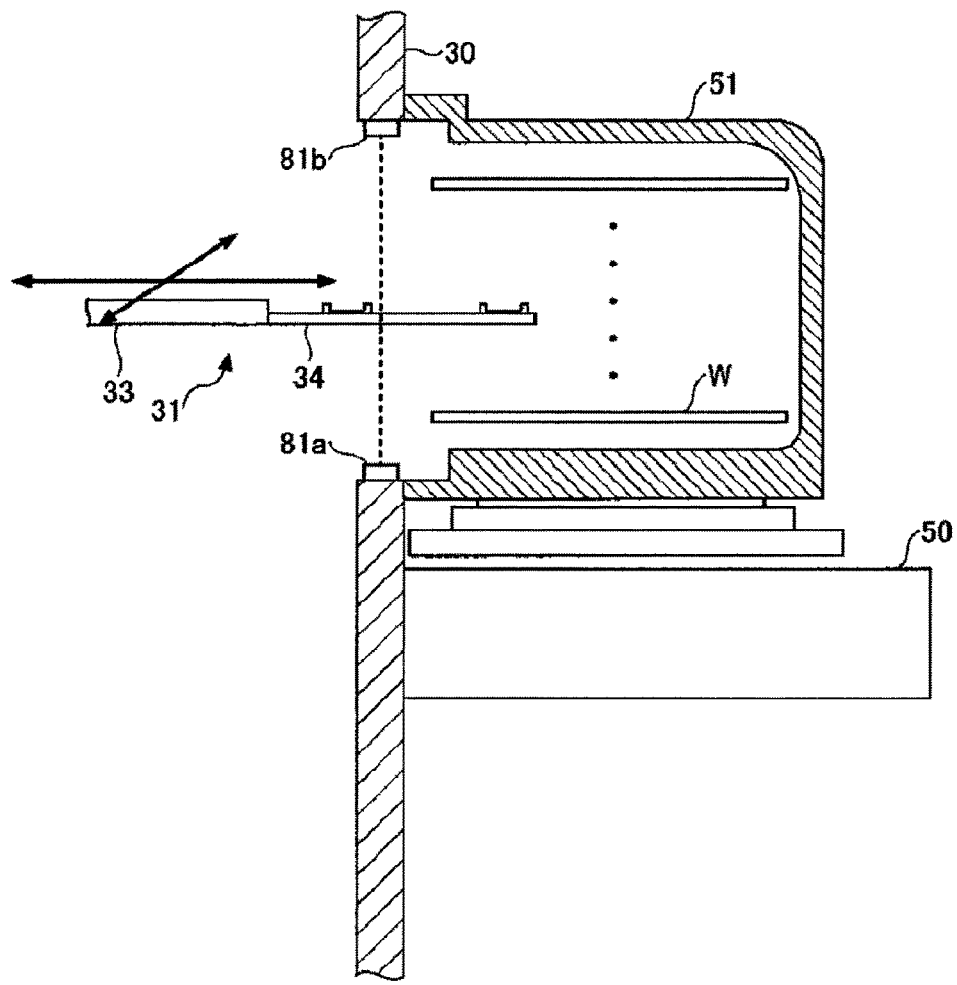
FIGS. 10A and 10B explain a process of determining a teaching position in a horizontal direction.
Figure 10B:
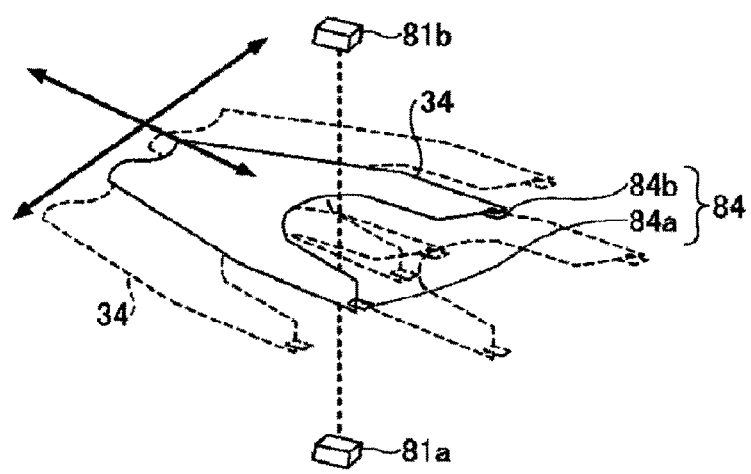

FIGS. 10A and 10B explain a step of determining a teaching position in the horizontal direction (the second step S12). FIGS. 10A and 10B are a cross-sectional view and a perspective view showing the positional relationship between the pick 34 and the emergence detection sensor 81 disposed at the load port 50, respectively.

In the present embodiment, the controller 100 controls the transfer device 31 to move the pick 34a in the horizontal direction so as to pass a position at which the detection light emitted from the light projecting unit 81a toward the light receiving unit 81b of the emergence detection sensor 81 is blocked and a position at which the detection light is not blocked. The position where the detection light is blocked is, e.g., the base portion 34a or the tip end portion 34b of the pick 34. The position where the detection light is not blocked is, e.g., a hole (not shown) formed through the base 34a of the pick 34 or a wafer holding region of the pick 34. The controller 100 determines the teaching position of the pick 34 in the horizontal direction based on the horizontal position of the pick 34 at which the amount of the detection light received by the light receiving unit 81b changes by a predetermined amount, and stores the determined teaching position in the auxiliary storage device 102. More specifically, the controller 100 determines the teaching position of the pick 34 in the horizontal direction based on the horizontal position of the pick 34 at which the amount of the detection light is changed by a predetermined change and the positional relationship between the emergence detection sensor 81 and the center of the wafer W in the transfer container 51. The positional relationship between the emergence detection sensor 81 and the center of the wafer W in the transfer container 51 is a gap determined by design, and is stored in advance in, e.g., the auxiliary storage device 102. In FIG. 10B, the pick 34 located at a position where the detection light is not blocked is indicated by a solid line; the pick 34 moved in the horizontal direction from the position indicated by the solid line is indicated by a dashed line; and the detection light is indicated by a dotted line.

The third step S13 is executed after the second step S12. The third step S13 includes an operation of determining the teaching position of the pick 34 in the vertical direction that is temporarily determined in the first step S11. The third step S13 may include an operation of storing the determined teaching position in, e.g., the auxiliary storage device 102.

Figure 11:
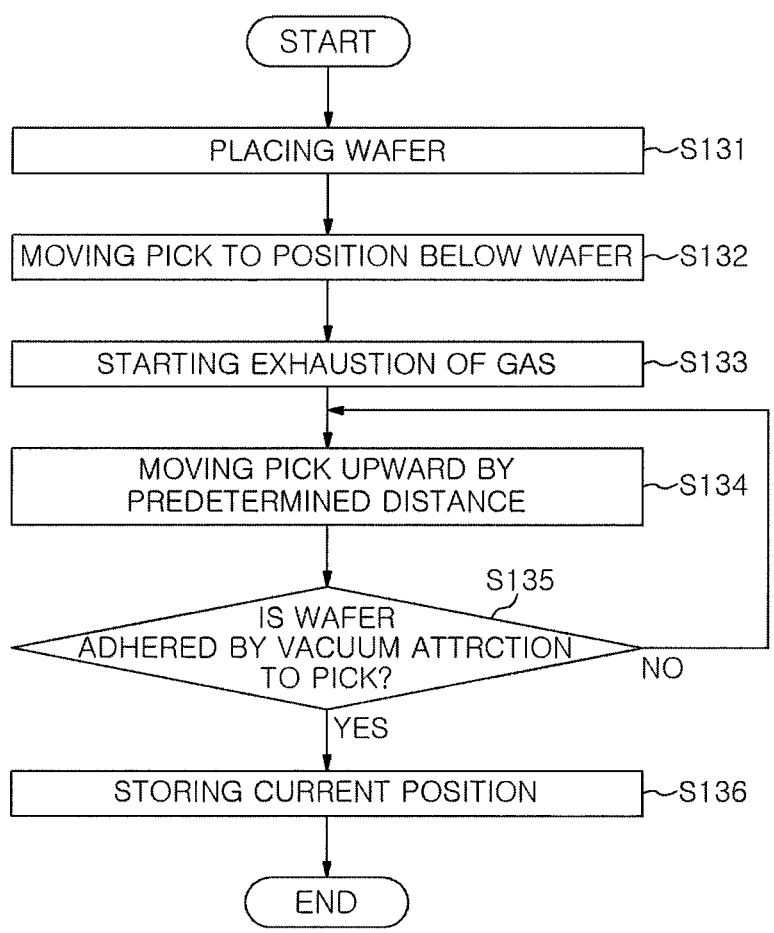
FIG. 11 is a flowchart for explaining a process of determining a teaching position in the vertical direction.

FIG. 11 is a flowchart for explaining a step of determining the teaching position in the vertical direction (third step S13). The third step S13 includes steps S131 to S136.

In step S131, the controller 100 places the transfer container 51 accommodating the wafer W on the load port 50. When the third step S13 is executed following the second step S12, the transfer container 51 already placed on the load port 50 may be used in the second step S12, and, thus, step S131 may be omitted in such case.

In step S132, the controller 100 moves down the pick 34 of the transfer device 31 to a position below the wafer W based on the vertical teaching position temporarily determined in the first step S11 and the horizontal teaching position determined in the second step S12. At this time, the multi-joint arm 33 of the transfer device 31 is extended.

In step S133, the controller 100 starts exhaustion of gas from the gas exhaust passage 34d and the gas exhaust line 34f by opening the valve 34h disposed in the gas exhaust line 34f. However, the timing of starting exhaustion of gas from the gas exhaust passage 34d and the gas exhaust line 34f is not limited thereto, and may be, e.g., before the pick 34 is moved to the position below the wafer W or during the movement of the pick 34 to the position below the wafer W.

In step S134, the controller 100 moves the pick 34 upward by a predetermined distance (e.g., 0.1 mm) while maintaining suction of the gas exhaust passage 34d and the gas exhaust line 34*f* and then stops the pick 34. Accordingly, the distance between the upper surface of the pick 34 and the backside of the wafer W is shortened.

In step S135, the controller 100 determines whether or not the wafer W is adhered, by vacuum attraction, to the pick 34. For example, the controller 100 determines whether or not the wafer W is adhered, by vacuum attraction, to the pick 34 based on whether or not the vacuum attraction pressure detected by the pressure sensor 34*g* reaches a predetermined threshold value or less within a predetermined period of time. Specifically, when the vacuum attraction pressure reaches a predetermined threshold value or less within the predetermined period of time, the controller 100 determines that the wafer W is adhered, by vacuum attraction, to the pick 34. On the other hand, when the vacuum attraction pressure does not reach a predetermined threshold value or less within the predetermined period of time, the controller 100 determines that the wafer W is not adhered, by vacuum attraction, to the pick 34. The predetermined period of time may be, e.g., a period of time required until the vacuum attraction pressure detected by the pressure sensor 34*g* becomes substantially constant. For example, the controller 100 may determine whether or not the wafer W is adhered, by vacuum attraction, to the pick 34 based on whether or not the amount of change in the vacuum attraction pressure at the time of moving the pick 34 upward by a predetermined distance with respect to the vacuum attraction pressure at the time when the pick 34 is disposed below the wafer W is greater than or equal to a predetermined threshold value. Specifically, when the amount of change in the vacuum attraction pressure is greater than or equal to the predetermined threshold value, the controller 100 determines that the wafer W is adhered, by vacuum attraction, to the pick 34. On the other hand, when the amount of changes in the vacuum attraction pressure is smaller than the predetermined threshold value, the controller 100 determines that the wafer W is not adhered, by vacuum attraction, to the pick 34. For example, when the transfer device 31 has a controller capable of determining whether or not the wafer W is adhered, by vacuum attraction, to the pick 34 based on the vacuum attraction pressure, the controller 100 may determine whether or not the wafer W is adhered, by vacuum attraction, to the pick 34 based on the determination result of the controller. Specifically, when the controller determines that the wafer W is adhered, by vacuum attraction, to the pick 34, the controller 100 also determines that the wafer W is adhered, by vacuum attraction, to the pick 34 based on the determination result of the controller. On the other hand, when the controller determines that the wafer W is not adhered, by vacuum attraction, to the pick 34, the controller 100 also determines that the wafer W is not adhered, by vacuum attraction, to the pick 34 based on the determination result of the controller.

When it is determined in step S135 that the wafer W is not adhered, by vacuum attraction, to the pick 34, the controller 100 determines that the backside of the wafer W is not in contact with the upper surface of the pick 34, and returns to step S134. In other words, the controller 100 intermittently moves the pick 34 upward until the wafer W is adhered, by vacuum attraction, to the pick 34. On the other hand, when it is determined in step S135 that the wafer W is adhered, by vacuum attraction, to the pick 34, the controller 100 determines that the backside of the wafer W is in contact with the upper surface of the pick 34, and proceeds to step S136.

In step S136, the position of the pick 34 (hereinafter, also referred to as "current position") at which it is determined in step S135 that the backside of the wafer W is in contact with the upper surface of the pick 34 is stored as a teaching position of the pick 34 in the vertical direction in the storage device 102, and the processing is ended.

By executing steps S131 to S136, the teaching position of the transfer device 31 in the vertical direction can be determined.

As described above, in the third step S13, the teaching position of the transfer device 31 in the vertical direction is determined based on the vacuum attraction pressure measured while moving up the pick 34 for holding, by vacuum attraction, the wafer W 34 from a position below the wafer W to a position thereabove. Accordingly, it is not necessary for an operator to visually detect the position, enabling to suppress variation in the teaching accuracy of the transfer device 31 in the vertical direction that may otherwise occur depending on skills of operators.

Further, a man-hour required for teaching the transfer device 31 can be reduced. In addition, since a jig dedicated to teaching is not required and it is easy to technically educate operators, the cost required for the teaching can be reduced.

In the third step S13, the position in the vertical direction where the upper surface of the pick 34 and the backside of the wafer W get in contact with each other is detected in a state where the multi-joint arm 33 is extended. Accordingly, it is possible to suppress degradation of the teaching accuracy due to a warpage of the pick 34 that may be caused by the weight of the pick 34 when the multi-joint arm 33 is extended.

Figure 12:
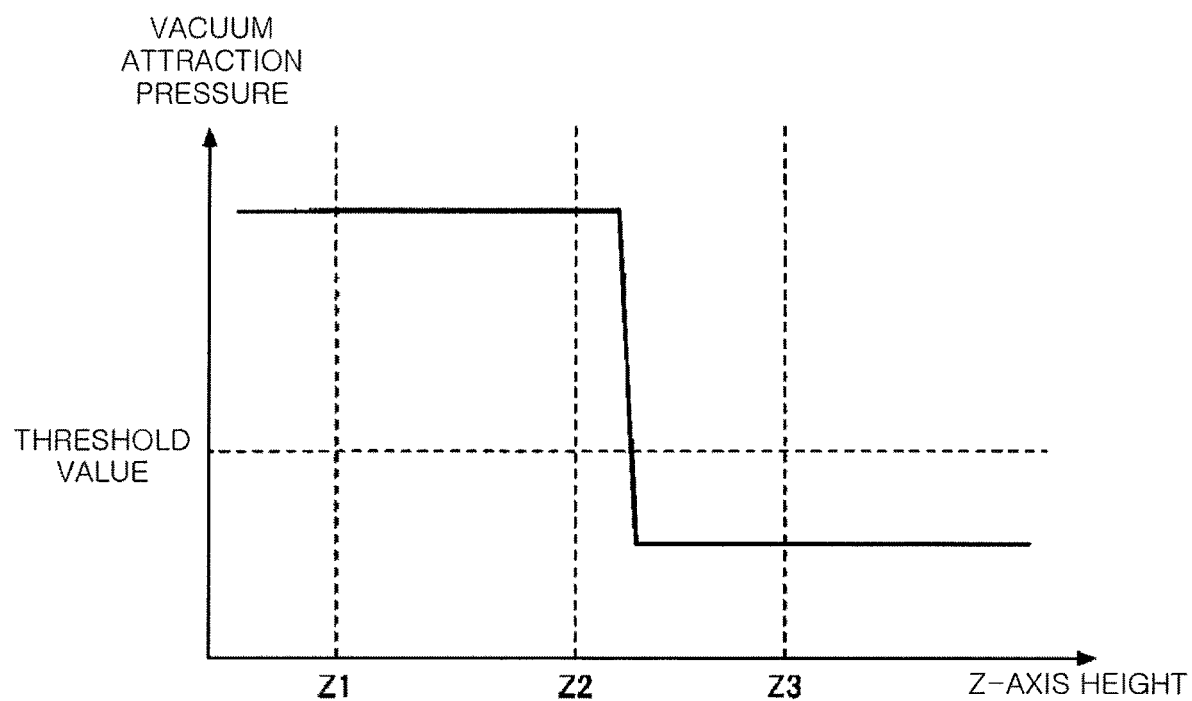
FIG. 12 shows a relationship between a height of a pick and an vacuum attraction pressure.
Figure 13A:
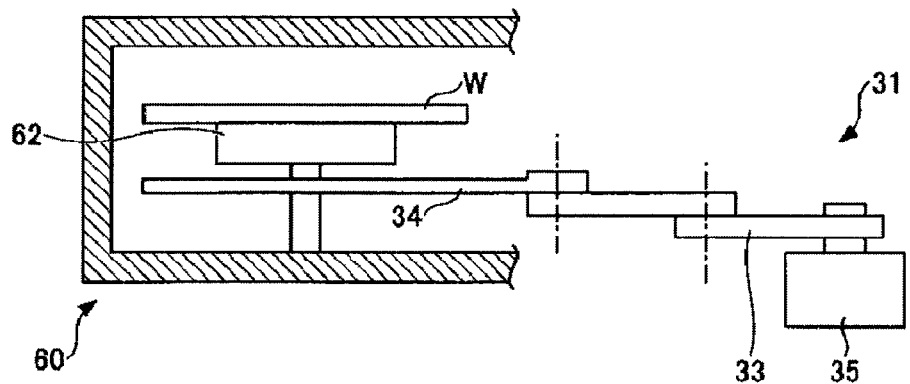
FIGS. 13A to 13C show a positional relationship between a pick and a wafer.
Figure 13B:
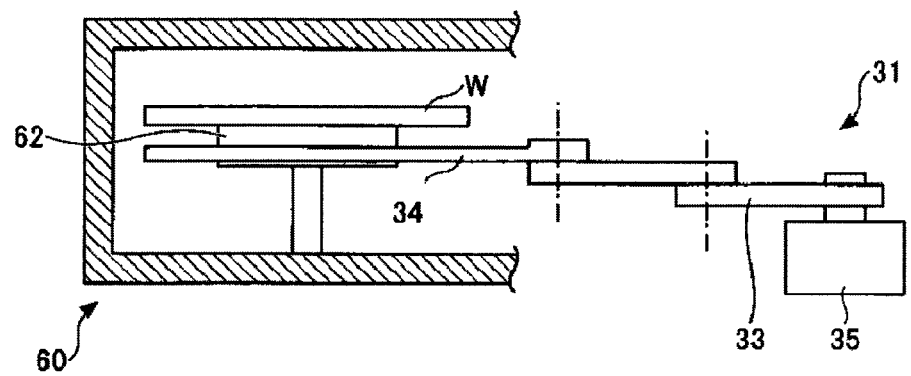
Figure 13C:
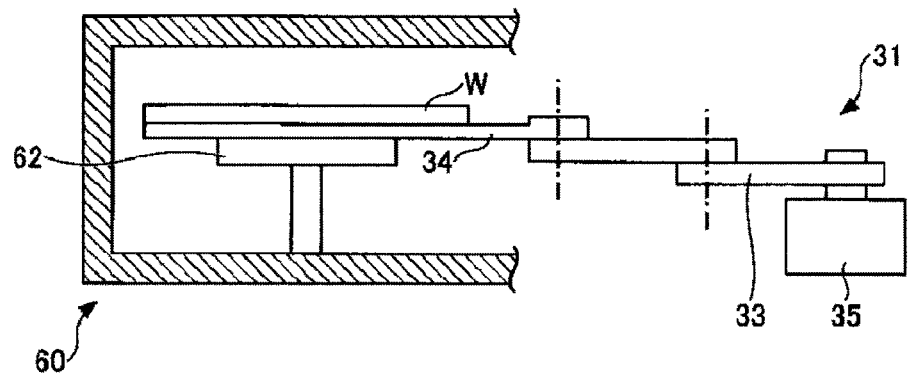

Next, the relationship between the height of the pick 34 and the vacuum attraction pressure in the third step S13 will be described. FIG. 12 shows the relationship between the height of the pick 34 and the vacuum attraction pressure. In FIG. 12, the vertical axis represents the vacuum attraction pressure detected by the pressure sensor 34*g*, and the horizontal axis represents the position of the pick 34 in the vertical direction (hereinafter, also referred to as "Z-axis height"). FIGS. 13A to 13C shows the positional relationship between the pick 34 and the wafer W. FIGS. 13A to 13C show the positional relationship between the pick 34 and the wafer W in the case where the Z-axis height in FIG. 12 is Z1 to Z3, respectively.

As shown in FIG. 13A, when the Z-axis height is Z1, the pick 34 is separated from the wafer W and the suction hole 34*e* of the pick 34 is opened, so that the vacuum attraction pressure increases as shown in FIG. 12.

As shown in FIG. 13B, when the Z-axis height is Z2, similarly to the case where the Z-axis height is Z1, the pick 34 is separated from the wafer W and the suction hole of the pick 34 is opened, so that the vacuum attraction pressure increases as shown in FIG. 12.

As shown in FIG. 13C, when the Z-axis height is Z3, the upper surface of the pick 34 is in contact with the backside of the wafer W and the suction hole 34*e* of the pick 34 is closed, so that the vacuum attraction pressure decreases as shown in FIG. 12.

As described above, the vacuum attraction pressure detected by the pressure sensor 34*g* changes when the upper surface of the pick 34 gets into contact with the backside of the wafer W.

In the present embodiment, as shown in FIG. 12, a pressure, which is higher than the vacuum attraction pressure at the position Z3 where the top surface of the pick 34 is in contact with the backside of the wafer W and lower than the vacuum attraction pressure at the positions Z1 and Z2 where the pick 34 is separated from the wafer W, is set as a threshold value. When the vacuum attraction pressure detected by the pressure sensor 34g is smaller than or equal to the threshold value, the controller 100 determines that the upper surface of the pick 34 is in contact with the backside of the wafer W, and stores the current position as a reference position in the auxiliary storage device 102 or the like.

The second teaching step S2 will be described with reference to FIG. 14. FIG. 14 explains an example of the second teaching step S2.

First, the wafer W is manually accommodated and accurately aligned such that the center of the wafer W lies on a predetermined reference position P1 in the transfer container 51 (see FIG. 14A). In the present embodiment, for example, a first slot that is a lowermost slot among twenty five slots of the transfer container 51 is defined as a predetermined position, and the wafer W is accurately aligned and accommodated in the first slot.

Then, the controller 100 drives the transfer device 31 based on the teaching position for the load port 50 determined in the first teaching step S1 such that the pick 34 enters the transfer container 51 and holds the wafer W. (see FIG. 14B).

Thereafter, the controller 100 controls the transfer device 31 to allow the pick 34 holding the wafer W to enter the aligner 60 and place the wafer W on the rotational stage 62 of the aligner 60 (see FIG. 14C).

Next, the controller 100 rotates the wafer W placed on the rotational stage 62, and calculates an eccentric amount Ar and an eccentric direction of the wafer W based on the values detected by the optical sensor 63 during the rotation of the wafer W (see FIG. 14D).

Then, the controller 100 adjusts the teaching position based on the calculated eccentric amount Ar and the calculated eccentric direction (see FIG. 14E). More specifically, the controller 100 adjusts the teaching position by the calculated eccentric amount Ar in a direction opposite to the eccentric direction and sets the adjusted position as a new teaching position. In FIG. 14E, the teaching position before the adjustment is indicated by a dashed line, and the teaching position after the adjustment is indicated by a solid line.

By executing the second teaching step S2, the accuracy of the teaching position of the transfer device 31 in the horizontal direction is improved.

As described above, in accordance with the embodiment, the controller 100 detects the vertical position of the wafer W using the mapping sensor 84 while moving the pick 34 in the vertical direction, and sets the teaching position of the pick 34 in the vertical direction based on the detected vertical position of the wafer W. Further, the controller 100 sets the teaching position of the pick 34 in the horizontal direction based on the horizontal position of the pick 34 at which the pick 34 is detected by the emergence detection sensors 81 to 83 disposed at the loader module 30 while moving the pick 34 in the horizontal direction. As described above, in accordance with the embodiment, the teaching operation is automatically performed by the controller 100 without the need that an operator manually sets the teaching position of the transfer device 31 while visually checking the pick 34. As a result, the time required for the teaching operation of the transfer device 31 can be shortened. Accordingly, the man-hour for starting the processing system 1 can be reduced. Further, it is possible to reduce the downtime of the processing system 1 due to a replacement of the transfer device 31 or components of the transfer device 31 and maintenance of the target into which the wafer W is loaded by the transfer device 31. Moreover, it is possible to suppress variation in the teaching accuracy of the transfer device 31 that may otherwise occur depending on skills of operators. In addition, a jig dedicated to teaching is not required and it is easy to technically educate operators, thereby reducing the cost required for the teaching.

In the above-described embodiment, the wafer W is an example of a substrate; the pick 34 is an example of a substrate holder; the emergence detection sensors 81 to 83 are examples of a second detection unit; and the mapping sensor 84 is an example of a first detection unit.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above-described embodiment, the case where the emergence detection sensors 81 to 83 and the mapping sensor 84 are transmissive sensors has been described. However, the present disclosure is not limited thereto. For example, the emergence detection sensors 81 to 83 and the mapping sensor 84 may be reflection-type sensors. Further, the emergence detection sensors 81 to 83 and the mapping sensor 84 may be sensors using a camera.

Further, in the above-described embodiment, the wafer W is used as an object detected by the mapping sensor 84 in the first step S11. However, the present disclosure is not limited thereto. The object may be, e.g., any means mounted to the loader module 30, the load-lock module 40, the load port 50, the aligner 60, or the like.

Further, in the above-described embodiment, the teaching method for setting the teaching position of the transfer device 31 disposed in an atmospheric transfer chamber has been described. However, the present disclosure is not limited thereto and may be applied to, e.g., a teaching method for setting a teaching position of the transfer device 11 disposed in a vacuum chamber.

Further, in the above-described embodiment, the case where the target transferred by the transfer device 31 is the wafer W has been described. However, the present disclosure is not limited thereto, and the target transferred by the transfer device 31 may be, e.g., a large substrate for a flat panel display (FPD), a substrate for an organic EL panel, or a substrate for a solar cell.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A teaching method of a transfer device including a substrate holder configured to hold a substrate and a first detector disposed at the substrate holder, the teaching method comprising:
    detecting a vertical position of an object by the first detector while moving the substrate holder in a vertical direction, and setting a teaching position of the substrate holder in the vertical direction based on the detected vertical position of the object;
    setting a teaching position of the substrate holder in a horizontal direction based on a horizontal position of the substrate holder at which the substrate holder is detected by a second detector while moving the substrate holder in the horizontal direction, the second detector being disposed at a position different from a position of the transfer device; and after the setting the teaching position of the substrate holder in the vertical direction, adjusting the teaching position in the vertical direction, wherein the transfer device further includes:
a suction hole for holding, by vacuum attraction, the substrate placed on an upper surface of the substrate holder; and
a pressure detector configured to detect a pressure of a suction passage communicating with the suction hole, and
wherein the adjusting the teaching position in the vertical direction includes:
moving the substrate holder to a position below the substrate;
moving up the substrate holder from the position below the substrate while sucking the suction passage and detecting a pressure in the suction passage;
determining whether or not the substrate holder is in contact with the substrate based on the pressure in the suction passage; and
adjusting the teaching position of the substrate holder in the vertical direction to the position of the substrate holder at which it is determined that the substrate holder is in contact with the substrate.

2. The teaching method of claim 1, wherein the first detector includes a light transmitter configured to irradiate the object with detection light and a light receiver configured to receive the detection light, and
the teaching position of the substrate holder in the vertical direction is set based on a vertical position of the substrate holder at which the detection light is blocked by the object.

3. The teaching method of claim 1, wherein the first detector is disposed at a tip end of the substrate holder.

4. The teaching method of claim 2, wherein the first detector is disposed at a tip end of the substrate holder.

5. The teaching method of claim 1, wherein the object is a substrate, and
the first detector is a mapping sensor configured to detect presence or absence of the substrate.

6. The teaching method of claim 3, wherein the object is a substrate, and
the first detector is a mapping sensor configured to detect presence or absence of the substrate.

7. The teaching method of claim 4, wherein the object is a substrate, and
the first detector is a mapping sensor configured to detect presence or absence of the substrate.

8. The teaching method of claim 5, wherein the second detector is an emergence detection sensor configured to detect emergence of the substrate from a transfer container accommodating the substrate.

9. The teaching method of claim 6, wherein the second detector is an emergence detection sensor configured to detect emergence of the substrate from a transfer container accommodating the substrate.

10. The teaching method of claim 7, wherein the second detector is an emergence detection sensor configured to detect emergence of the substrate from a transfer container accommodating the substrate.

11. The teaching method of claim 1, wherein the second detector includes a light transmitter configured to irradiate the object with detection light and a light receiver configured to receive the detection light, and
the teaching position of the substrate holder in the horizontal direction is set based on a horizontal position of the substrate holder at which the substrate holder blocks the detection light of the second detector.

12. The teaching method of claim 2, wherein the second detector includes a light transmitter configured to irradiate the object with detection light and a light receiver configured to receive the detection light, and
the teaching position of the substrate holder in the horizontal direction is set based on a horizontal position of the substrate holder at which the substrate holder blocks the detection light of the second detector.

13. The teaching method of claim 4, wherein the second detector includes a light transmitter configured to irradiate the object with detection light and a light receiver configured to receive the detection light, and
the teaching position of the substrate holder in the horizontal direction is set based on a horizontal position of the substrate holder at which the substrate holder blocks the detection light of the second detector.

14. The teaching method of claim 7, wherein the second detector includes a light transmitter configured to irradiate the object with detection light and a light receiver configured to receive the detection light, and
the teaching position of the substrate holder in the horizontal direction is set based on a horizontal position of the substrate holder at which the substrate holder blocks the detection light of the second detector.

15. The teaching method of claim 10, wherein the second detector includes a light transmitter configured to irradiate the object with detection light and a light receiver configured to receive the detection light, and
the teaching position of the substrate holder in the horizontal direction is set based on a horizontal position of the substrate holder at which the substrate holder blocks the detection light of the second detector.

16. A processing system comprising:
a processing apparatus and a controller, wherein the processing apparatus includes:
a transfer device having a substrate holder configured to hold a substrate and a first detector disposed at the substrate holder; and
a second detector disposed separately from the transfer device,
wherein the transfer device further includes:
a suction hole for holding, by vacuum attraction, the substrate placed on an upper surface of the substrate holder; and
a pressure detector configured to detect a pressure of a suction passage communicating with the suction hole, and
the controller is configured to control the processing apparatus to:
detect a vertical position of an object by the first detector while moving the substrate holder in a vertical direction and set a teaching position of the substrate holder in the vertical direction based on the detected vertical position of the object,
set a teaching position of the substrate holder in a horizontal direction based on a horizontal position of the substrate holder at which the substrate holder is detected by the second detector disposed at a position different from a position of the transfer device while moving the substrate holder in the horizontal direction, after the teaching position of the substrate holder in the vertical direction is set, adjust the teaching position in the vertical direction,
wherein the adjusting the teaching position in the vertical direction includes:
move the substrate holder to a position below the substrate;
move up the substrate holder from the position below the substrate while sucking the suction passage and detecting a pressure in the suction passage;
determine whether or not the substrate holder is in contact with the substrate based on the pressure in the suction passage; and
adjust the teaching position of the substrate holder in the vertical direction to the position of the substrate holder at which it is determined that the substrate holder is in contact with the substrate.

\* \* \* \* \*